(12) United States Patent
Callegari et al.

(10) Patent No.: US 6,573,197 B2
(45) Date of Patent: Jun. 3, 2003

(54) THERMALLY STABLE POLY-SI/HIGH DIELECTRIC CONSTANT MATERIAL INTERFACES

(75) Inventors: Alessandro C. Callegari, Yorktown Heights, NY (US); Evgeni Gousev, Mahopac, NY (US); Michael A. Gribelyuk, Poughquag, NY (US); Paul C. Jamison, Hopewell Junction, NY (US); Dianne L. Lacey, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/833,550

(22) Filed: Apr. 12, 2001

(65) Prior Publication Data

US 2002/0151142 A1 Oct. 17, 2002

(51) Int. Cl.⁷ .................... H01L 21/31; H01L 21/3205; H01L 29/76
(52) U.S. Cl. .................. 438/791; 438/200; 438/592; 438/287; 438/778; 438/488; 438/591; 257/411; 257/406; 257/349; 257/649
(58) Field of Search ................ 438/791, 287, 438/681, 686, 240, 239, 488, 592, 591, 253, 585, 305, 762, 397, 398, 216, 682, 674, 676, 680, 3, 650, 654, 778, 685, 763, 200; 257/411, 406, 649, 349

(56) References Cited

U.S. PATENT DOCUMENTS

| | | | | |
|---|---|---|---|---|
| 6,063,689 | A | * | 5/2000 | Tseng ........................ 438/585 |
| 6,335,238 | B1 | * | 1/2002 | Hanttangady et al. ...... 438/240 |
| 6,451,641 | B1 | * | 9/2002 | Halliyal et al. ............. 438/200 |
| 2002/0173130 | A1 | * | 11/2002 | Pomerede et al. .......... 438/592 |

* cited by examiner

Primary Examiner—Matthew Smith
Assistant Examiner—Igwe U. Anya
(74) Attorney, Agent, or Firm—Scully, Scott, Murhpy & Presser; Robert M. Trepp, Esq.

(57) ABSTRACT

The present invention provides a method of fabricating a thermally stable polysilicon/high-k dielectric film stack utilizing a deposition method wherein Si-containing precursor gas which includes silicon and hydrogen is diluted with an inert gas such as He so as to significantly reduce the hydrogen content in the resultant polysilicon film. Semiconductor structures such as field effect transistors (FETs) and capacitors which include at least the thermally stable polysilicon/high-k dielectric film stack are also provided herein.

39 Claims, 4 Drawing Sheets

THERMALLY STABLE POLY-SI/HIGH DIELECTRIC CONSTANT MATERIAL INTERFACES

FIELD OF THE INVENTION

The present invention relates to semiconductor devices, and more particularly to a method for forming a polysilicon (i.e., poly Si) layer over a high-dielectric constant, i.e., high-k, dielectric material, wherein an interface exists between the poly Si and the high-k dielectric material which is uniform and has high thermal stability. Semiconductor structures such as field effect transistors (FETs) and capacitors comprising at least a poly Si layer formed over a high-k dielectric material, wherein an interface exists between the poly Si and the high-k dielectric material which is uniform and has high thermal stability, are also provided herein.

BACKGROUND OF THE INVENTION

Dielectric materials in high-density circuits appear as capacitors in dynamic random access memory (DRAM) applications, gate dielectrics in transistors and as decoupling capacitors. The dielectric materials in these structures are typically silicon dioxide ($SiO_2$), silicon nitride ($Si_3N_4$) or any combination thereof These dielectric materials typically have a relative dielectric constant of 8.0 or below.

As today's generation of circuits become smaller and smaller, the dielectric materials employed therein must be made thinner to satisfy circuit requirements. The use of ultra-thin, conventional relatively low-dielectric constant materials in today's circuits is undesirable since such materials lead to leaky circuits. Thus, it would be beneficial if the dielectric constant of the dielectric material used in such circuits could be increased.

A variety of high-dielectric constant, i.e., high-k, materials such as binary metal oxides including aluminum oxide ($Al_2O_3$), zirconium oxide ($ZrO_2$), hafnium oxide ($HfO_2$), lanthanum oxide ($La_2O_3$), titanium oxide ($TiO_2$), as well as their silicates and aluminates; and perovskite-type oxides including a titanate system material such as barium titanate, strontium titanate, barium strontium titanate (BST), lead titanate, lead zirconate titanate, lead lanthanum zirconate titanate, barium lanthanum titanate, barium zirconium titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, barium titanium niobate; and Bi-layered perovskite system material such as strontium bismuth tantalate, bismuth titanate are known in the art.

Fabrication of integrated circuits using a high-k dielectric material to replace $SiO_2$ has encountered a major problem with poly Si/high-k interface stability. For example, during the activation annealing at 1000° C., 5 seconds interface instabilities are formed in the structure which greatly degrade the electrical properties of the device.

Figure 1:
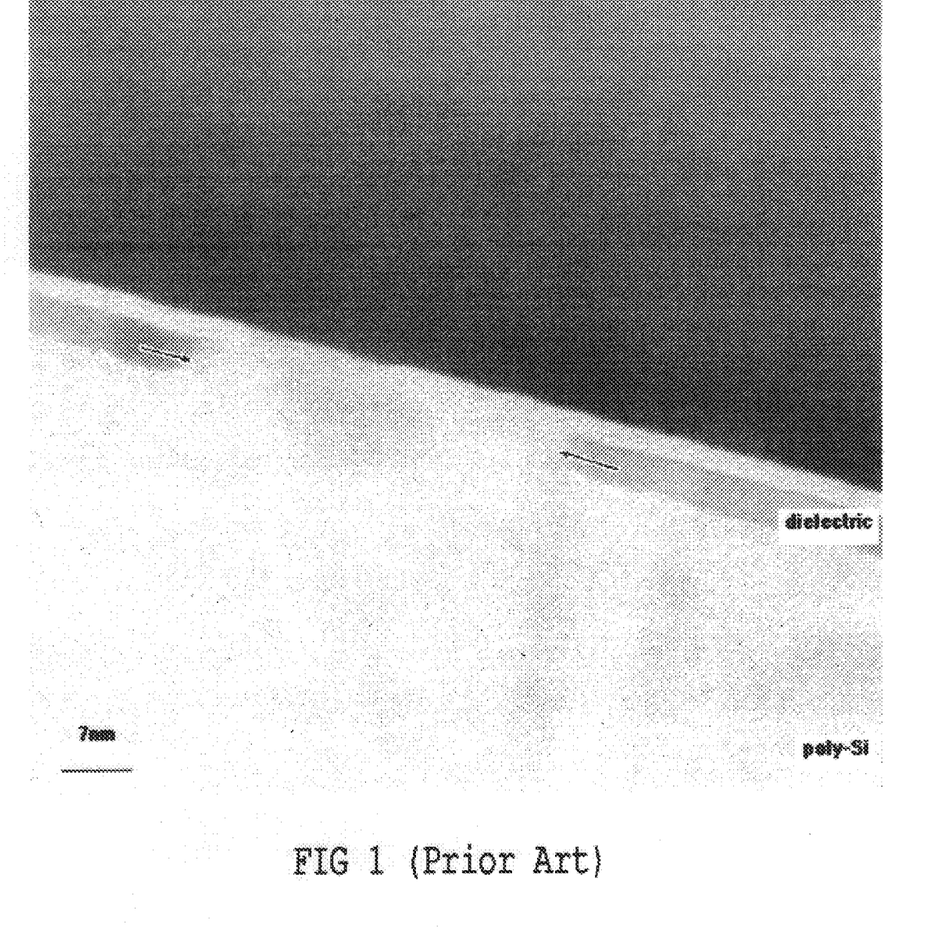
FIG. 1 is a transmission electron micrograph (TEM) of a prior art poly Si/ZrO$_2$ film stack.

This degradation is clearly seen in prior art FIG. 1. This figure shows an interface of poly Si/$ZrO_2$ after being annealed at 1000° C., 5 seconds. Note that the film is not uniform and strong reactions are present at the poly Si/$ZrO_2$ interface. The arrow shows that part of the film is etched away. In this prior art figure, the poly Si was deposited over the high-k dielectric material using a conventional low-pressure chemical vapor deposition (LPCVD) reactor. The wafer containing deposited high-k dielectric material was heated in the reactor chamber at about 620° C. and then an undiluted Si-containing precursor gas, e.g., $SiH_4$, was introduced in the reactor and a poly Si film was deposited on top of the $ZrO_2$.

In view of the instability problem that exists in prior art poly Si/high-k dielectric film stacks, there is a continued need for developing a new and improved method for forming a poly Si layer over a high-k dielectric material in which the resulting interface between the poly Si layer and the high-k dielectric is uniform and thus has a higher stability as compared with prior art poly Si/high-k dielectric film stacks.

SUMMARY OF THE INVENTION

One object of the present invention is to provide a method of forming a poly Si layer over a high-k dielectric material in which the interface between the poly Si and the high-k dielectric material is uniform.

Another object of the present invention is to provide a method of forming a poly Si layer over a high-k dielectric material in which the interface between the poly Si and the high-k dielectric material is thermally stable, i.e., no reactions between the poly Si and the high-k dielectric material are observed during high-temperature activation annealing.

A further object of the present invention is to provide a method of forming a poly Si layer over a high-k dielectric material using a technique that is compatible with existing complementary metal oxide semiconductor (CMOS) and/or back-end-of-the line (BEOL) processing steps.

A yet further object of the present invention is to provide a method of forming a poly Si layer over a high-k dielectric material which avoids the use of an undiluted Si-containing precursor gas.

A still further object of the present invention is to provide a method of forming a poly Si layer over a high-k dielectric material in which less hydrogen gets incorporated into the resultant poly Si/high-k dielectric film stack.

These and other objects and advantages are achieved in the present invention by employing a method wherein the poly Si layer is deposited using a Si-containing precursor gas that is diluted with an inert gas. The term "Si-containing precursor gas" as used herein denotes a gas which includes silicon and hydrogen. The inventors have unexpectedly found that improved poly Si/high-k dielectric interface stability can be achieved if the poly Si deposition is carried out in a Si-containing precursor gas that is diluted with an inert gas such that the hydrogen content that is being incorporated into the resultant film is less than that of an undiluted Si-containing precursor gas.

Specifically, the method of the present invention comprises the steps of:

(a) heating a semiconductor structure containing an exposed surface of high-k dielectric material to a temperature of from about 350° to about 750° C. inside a deposition reactor chamber, said high-k dielectric material having a dielectric constant, k, of greater than 8; and (b) depositing a layer of polysilicon on said exposed surface of said high-k dielectric material, wherein said depositing is performed in said reactor chamber using a Si-containing precursor gas which is diluted with an inert gas whereby said layer of polysilicon has a lower hydrogen content than that obtained from an undiluted Si-containing precursor gas.

In one embodiment of the present invention, an interfacial oxide, oxynitride, and/or nitride layer is formed on the structure prior to deposition of the high-k dielectric material.

Another aspect of the present invention relates to semiconductor structures which are fabricated utilizing at least the method of the present invention. The inventive semiconductor structure comprises:

a semiconductor substrate having an upper surface;

a layer of high-k dielectric material formed on said upper surface, said high-k dielectric material having a dielectric constant, k, of greater than 8; and a layer of polysilicon formed on said layer of high-k dielectric material, wherein an interface exists between said high-k dielectric material and said polysilicon that is uniform.

The term "uniform" as used herein denotes an interface region that is continuous, i.e., the interface has no breaks therein. Moreover, the interface region of the present invention is substantially planar and it follows the contour of the underlying high-k dielectric material. Because the interface region is uniform, the high-k dielectric material has a thickness that is substantially constant.

Examples of semiconductor structures that are contemplated in the present invention include, but are not limited to: FETs, and capacitors. In some embodiments of the present invention, especially when the semiconductor substrate is a Si-containing semiconductor substrate, an interfacial oxide, oxynitride, and/or nitride layer is formed on the upper surface of the semiconductor substrate and then the high-k dielectric is formed on said interfacial layer.

DETAILED DESCRIPTION OF THE INVENTION

The present invention, which relates to a method of forming a thermally stable poly Si/high-k dielectric film stack, will now be described in more detail by referring to the drawings that accompany the present application. It is noted that in the accompanying drawings like and/or corresponding elements are referred to by like reference numerals.

Figure 2:
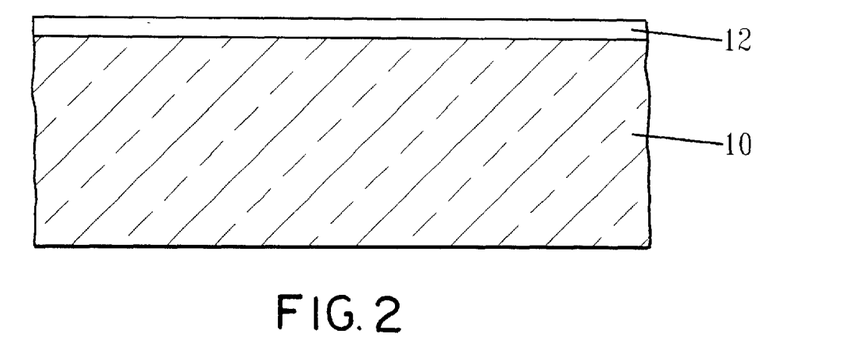
FIGS. 2–4 are pictorial representations (through cross-sectional views) showing the processing steps that are employed in the present invention in forming a thermally stable poly Si/high-k dielectric film stack.

Reference is first made to FIG. 2 which illustrates a semiconductor structure that is formed after an optional, but highly preferred, processing step is employed in the present invention. Specifically, FIG. 2 illustrates a semiconductor structure that is formed after forming ultra-thin (on the order of less than about 10 Å) interfacial oxide, oxynitride and/or nitride layer 12 on a surface of semiconductor substrate 10.

Semiconductor substrate (i.e., wafer or chip) 10 employed in the present invention is composed of any semiconducting material, including, but not limited to: Si, Ge, SiGe, GaP, InAs, InP and all other III/V compound semiconductors. The substrate may also be composed of a layered semiconductor such as Si/SiGe or Si/SiO$_2$/Si. The substrate may be of the n or p-type depending on the type of device or devices to be fabricated. Moreover, the substrate may contain various isolation regions such as shallow trench isolation (STI) regions, LOCOS (local oxidation of silicon) regions or other like isolation regions either formed in the substrate or on a surface thereof. Additionally, the substrate may include diffusion regions therein. For clarity, the isolation and diffusion regions are not shown in the drawings of the present invention, but are nevertheless intended to be included with substrate 10. Of the various substrates mentioned above, it is preferred that substrate 10 be composed of Si.

The semiconductor substrate may also include an active device region (not shown in the FIGS. 2–4, but meant to be included within region 10) in which electrons are allowed to flow freely therethrough. For example, the active device region may be a channel region of a transistor in which electrons can freely migrate from the source region to the drain region.

Next, ultra-thin interfacial oxide, oxynitride and/or nitride layer 12 may optionally be formed on a surface of semiconductor substrate 10 utilizing one of the processing techniques described in co-pending and co-assigned U.S. patent application Ser. No. 09/597,765, filed Jun. 20, 2000, the entire content of which is incorporated herein by reference. Thus, optional interfacial oxide, oxynitride and/or nitride layer 12 may be formed by rapid thermal oxidation (RTO), nitridation (RTN), and/or oxynitridation (RTON) processes; remote or direct plasma oxidation (RO); wet chemical oxidation or any other process described in the '765 application.

The ultra-thin interfacial oxide, oxynitride and/or nitride layer that may be employed in the present invention has a thickness of less than about 10 Å, with a thickness of from about 2 to about 8 Å being more highly preferred. The present invention also contemplates mixtures or multilayers of said oxide, oxynitride or nitride.

After formation of the interfacial oxide, oxynitride and/or nitride layer, the ultra-thin interfacial layer may be optionally patterned so that it is present only above the active device region, or alternatively, patterning may occur after formation of the high-k dielectric material. Patterning is achieved utilizing any conventional patterning process such as lithography and etching. The lithography step includes applying a photoresist, patterning the photoresist and developing the pattern. The etching step includes any conventional dry etch process such as reactive-ion etching (RIE), ion-beam etching (IBE) and plasma etching.

Figure 3:
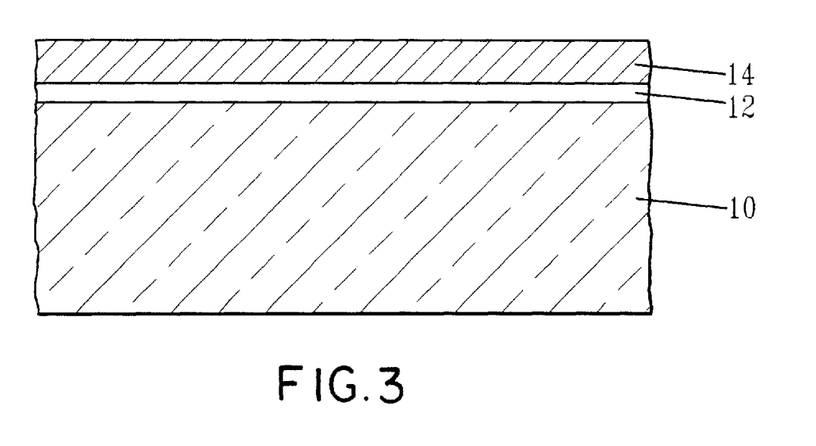

FIG. 3 shows the formation of high-k dielectric material 14 on ultra-thin interfacial oxide, oxynitride and/or nitride layer 12. Note that in embodiments wherein the interfacial layer is not formed on the substrate, the high-k dielectric material is formed directly upon an exposed upper surface of semiconductor substrate 10. The term "high-k dielectric" denotes any dielectric material having a dielectric constant relative to a vacuum of greater than 8. Examples of such high-k dielectrics, include, but are not limited to: binary metal oxides such as TiO$_2$, Ta$_2$O$_5$, Al$_2$O$_3$, Y$_2$O$_3$, ZrO$_2$, HfO$_2$, Gd$_2$O$_3$, and La$_2$O$_3$; silicates and aluminates of said binary metal oxides; and perovskite-type oxides. Combinations and/or multilayers of such high-k dielectrics are also contemplated herein. The perovskite-type oxides may be in the crystalline or amorphous phase.

Examples of perovskite-type oxides that may be employed in the present invention as the high-k dielectric material include, but are not limited to: a titanate system material, i.e., barium titanate, strontium titanate, barium strontium titanate, lead titanate, lead zirconate titanate, lead lanthanum zirconate titanate, barium zirconium titanate and barium lanthanum titanate; a niobate or tantalate system material such as lead magnesium niobate, lithium niobate, lithium tantalate, potassium niobate, strontium aluminum tantalate and potassium tantalum niobate; a tungsten-bronze system material such as barium strontium niobate, lead barium niobate, and barium titanium niobate; or a Bi-layered perovskite system material such as strontium bismuth tantalate, and bismuth titanate.

Of the various high-k dielectrics mentioned above, preference is given to binary oxides or aluminate high-k materials. Highly preferred binary oxides employed in the present invention are $Al_2O_3$, $ZrO_2$, $TiO_2$, $HfO_2$ or $Ta_2O_3$.

The high-k dielectric material is formed utilizing any conventional deposition process, including, but not limited to: chemical vapor deposition (CVD), atomic layer CVD, rapid thermal CVD, plasma-assisted CVD, sputtering, plating, evaporation, chemical solution deposition and other like deposition processes. The physical thickness of the high-k dielectric material employed in the present invention may vary depending on the dielectric constant and the deposition process used in forming the same. Typically, however, the high-k dielectric has a thickness of from about 10 to about 100 Å, with a thickness of from about 20 to about 50 Å being more highly preferred.

Following deposition of the high-k dielectric, the high-k dielectric material or both the high-k dielectric and the underlying ultra-thin interfacial layer may be patterned using the above mentioned lithography and etching steps. When both layers are to be patterned post deposition of the high-k dielectric, the etching step may include a combination of the aforesaid dry etching processes as well as the use of a chemical wet etch process.

Following deposition of high-k dielectric material 14 on either semiconductor substrate 10, or interfacial layer 12, a layer of polysilicon 16 is formed on an exposed surface of high-k dielectric material 14 by utilizing the inventive method of the present invention in which a stable and uniform interface region 18 is formed between high-k dielectric material 14 and polysilicon 16. The resultant structure after formation of the polysilicon on the high-k dielectric is shown, for example, in FIG. 4.

Figure 4:
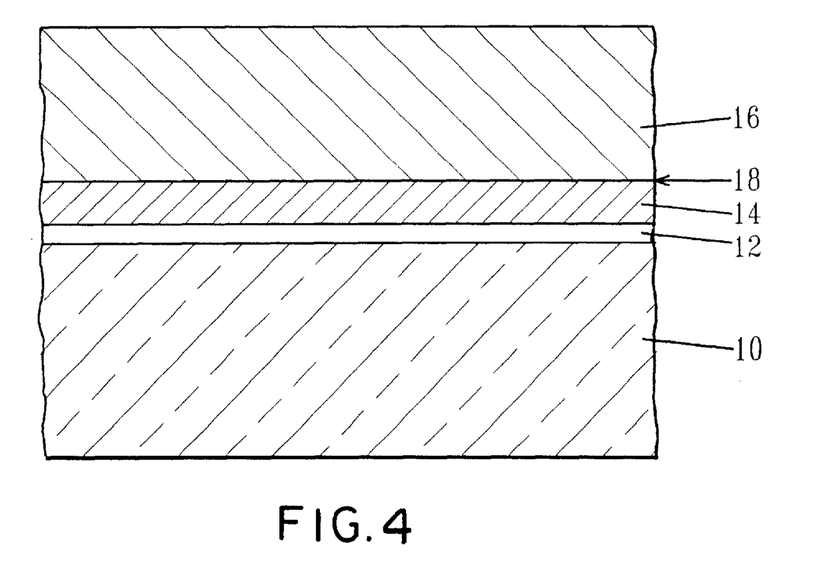

The physical thickness of the deposited polysilicon may vary depending on the final device to be fabricated as well as the deposition process used in forming the same. Typically, however, the polysilicon layer has a thickness of from about 500 to about 3000 Å, with a thickness of from about 1200 to about 1700 Å being more highly preferred.

Specifically, the layer of polysilicon is formed in the present invention by first heating the structure containing an exposed surface of high-k dielectric material to a temperature of from about 350° to about 700° C., with a temperature of from about 500° to about 600° C. being more highly preferred, inside a deposition reactor chamber; and thereafter depositing the layer of polysilicon on the exposed surface of said high-k dielectric material using a Si-containing precursor gas which is diluted with an inert gas whereby the resultant layer of polysilicon has a lower content of hydrogen than that obtained from a undiluted Si-containing precursor gas. Typically, in the present invention, the resultant layer of polysilicon has a hydrogen content of less than about 50 atomic percent, with a hydrogen content of less than about 40 atomic percent being more highly preferred.

Suitable deposition reactor chambers that can be employed in the present invention, include, but are not limited to: chemical vapor deposition (CVD) reactor chambers, plasma enhanced chemical vapor deposition (PECVD) reactor chambers or any other reactor chamber which is capable of depositing polysilicon from a Si-containing precursor gas. The reactor chambers employed in the present invention are conventional; therefore a detailed discussion regarding the design of the reactor chamber is not critical herein. Notwithstanding the type of reactor chamber employed in the present invention for depositing polysilicon on the exposed surface of the high-k dielectric, the reactor chamber typically includes a holder means for placing and holding the structure, gas inlet means for introducing a precursor gas or gases into the reactor chamber, gas focusing means for directing the precursor gas or gases to the structure, a heater for heating the substrate, and optionally the precursor gas (or gases), and vacuum ports for pumping the reactor chamber to a desired base pressure in the range of from about 2 mtorr to about 10 torr. The reactor chamber may further include an anode and a cathode.

As stated above, polysilicon layer 16 is formed utilizing a Si-containing precursor gas which is diluted with an inert gas. The term "Si-containing precursor gas" as used herein denotes a gas which includes Si and H. Moreover, the term "Si-containing precursor gas" denotes a silicon-containing compound or mixtures thereof having the formula $H_{4-x}SiR_x$, wherein R is alkyl, alkene, alkynyl, alkoxy, halide, amine, aryl, cycloalkene or mixtures thereof, and x is 0, 1, 2, or 3. The substituent R may be unsubstituted or it may be substituted with one or more substituents. Moreover, the R substituent may be straight chained or branched.

Typically, in the present invention from about 1 to about 90 weight % of inert gas is added to 100 weight % of said Si-containing precursor gas, with a weight % of said inert gas of from about 2 to about 10 being more highly preferred.

Illustrative examples of various Si-containing precursor gases that may be employed in the present invention include, but are not limited to: silane, disilane, dimethylsilane, diethylsilane, dichlorosilane and mixtures thereof. Of these Si-containing precursor gases, it is preferred to use silane, i.e., $SiH_4$, in the present invention. The Si-containing precursor gas may, or may not, be doped with a doping agent such as B, As, Sb, or P.

The term "inert gas" as used in the present invention includes He, Ar, Ne, Xe, Kr, $N_2$ or mixtures thereof. Of these inert gases, it is preferred to employ He as the inert gas to dilute the Si-containing precursor gas. Note that the dilution may occur outside of the reactor chamber, or alternatively, the dilution may occur within the reactor chamber itself.

Following deposition of the polysilicon onto the exposed surface of the high-k dielectric material, the flow of precursor gas is typically turned off, and the temperature of the reactor chamber, including the structure, is lowered to a temperature below about 200° C. to remove the structure from the reactor chamber. Note that the inert gas flow may or may not be turned off during the cooling step.

At this point of the present invention, and if not previously performed in-situ, the layer of polysilicon may be doped with one of the above-mentioned doping agents by utilizing a conventional ion implantation process. Following the formation of doped polysilicon, the doped polysilicon may be annealed utilizing a furnace anneal or a rapid thermal annealing process may be performed. Typically, when a rapid thermal anneal is performed, it is carried out at a temperature of from about 800° to about 1050° C. for a period of time of from about 1 to about 30 seconds. More preferably, when rapid thermal annealing is employed, the annealing step may be performed at a temperature of from about 950° to about 1005° C. for a time period of from about 5 to about 10 seconds. As stated above, annealing may be carried out by a furnace anneal utilizing the same temperatures as mentioned above; however, longer anneal times are typically required for furnace anneals. The annealing may be carried out at a single reaction temperature, or alternatively, various ramp and soak cycles may be employed.

Figure 5:
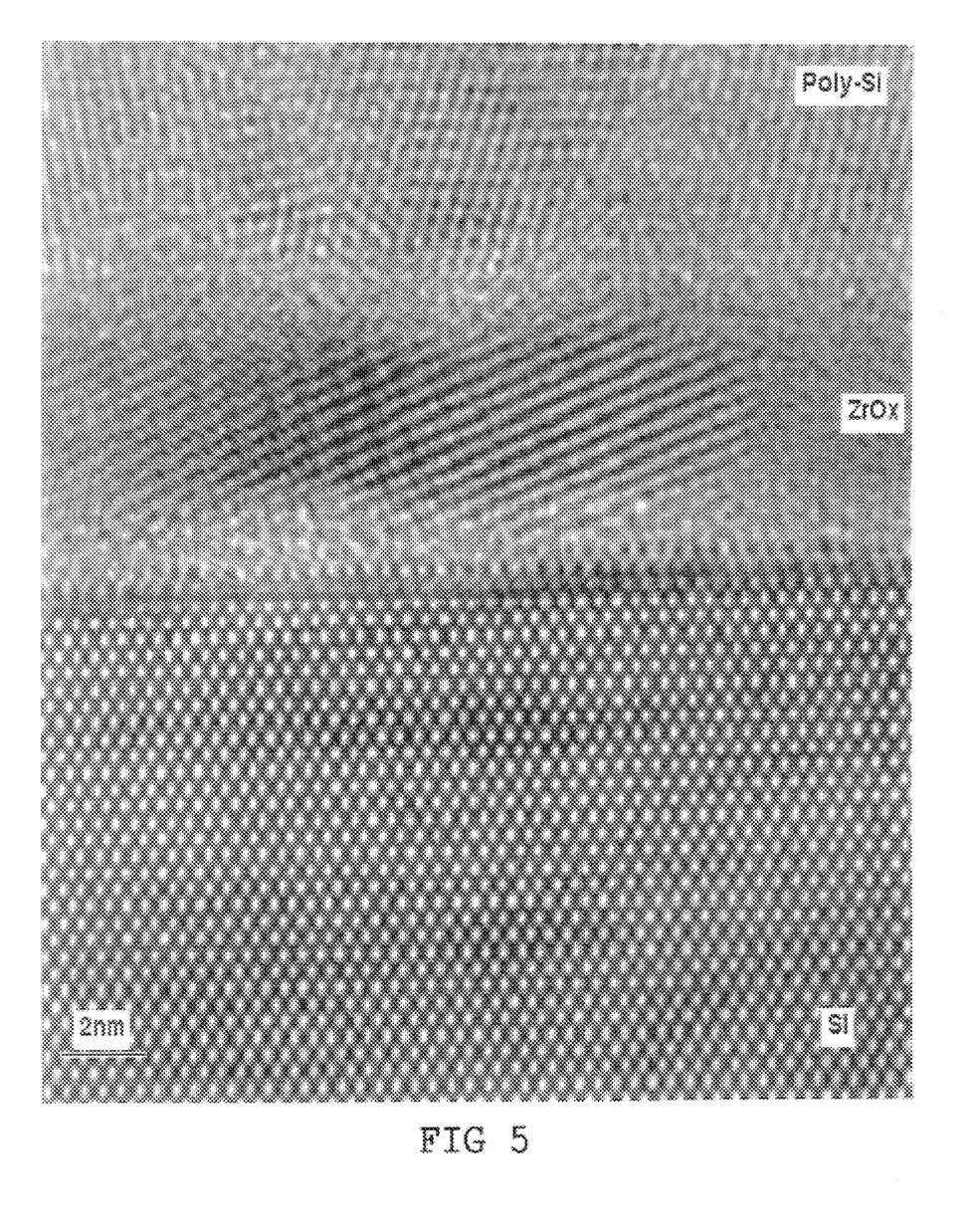
FIG. 5 is a TEM of a poly Si/ZrO$_2$ film stack that is prepared utilizing the method of the present invention.

It is noted that the dilution of Si-containing precursor gas with an inert gas unexpectedly produces an interface region, i.e., region 18, between the polysilicon and high-k dielectric material which is uniform. Moreover, no reactions between the polysilicon and the high-k dielectric material are observed when the method of the present invention is employed. Hence, by employing a diluted Si-containing precursor gas rather than an undiluted precursor gas less hydrogen may be incorporated into the polysilicon/high-k dielectric film stack which leads to higher stability. The higher stability of the film stack may also be due to the inert gas diluted plasma which forms denser and more stable films when compared to other gases. FIG. 5 is a TEM of a poly Si/$ZrO_2$ film stack that is prepared utilizing the inventive method. In the specific example, the Si-containing gas was silane that was diluted with 2% He; the polysilicon deposition temperature was 530° C.; and annealing was carried out at 1000° C. for 5 seconds. Note that the interface between poly Si and $ZrO_2$ is sharp, i.e., uniform, as compared with that shown in FIG. 1.

At this point of the inventive method, conventional CMOS processing steps including patterning, formation of diffusion regions, and sidewall gate oxidations as well as conventional BEOL (back-end-of-the-line) processes may be performed depending on the final device to be fabricated. It is noted that the structure shown in FIG. 4 may represent a capacitor structure of the present invention, with region 12, i.e., the interfacial layer, being optionally present.

Figure 6:
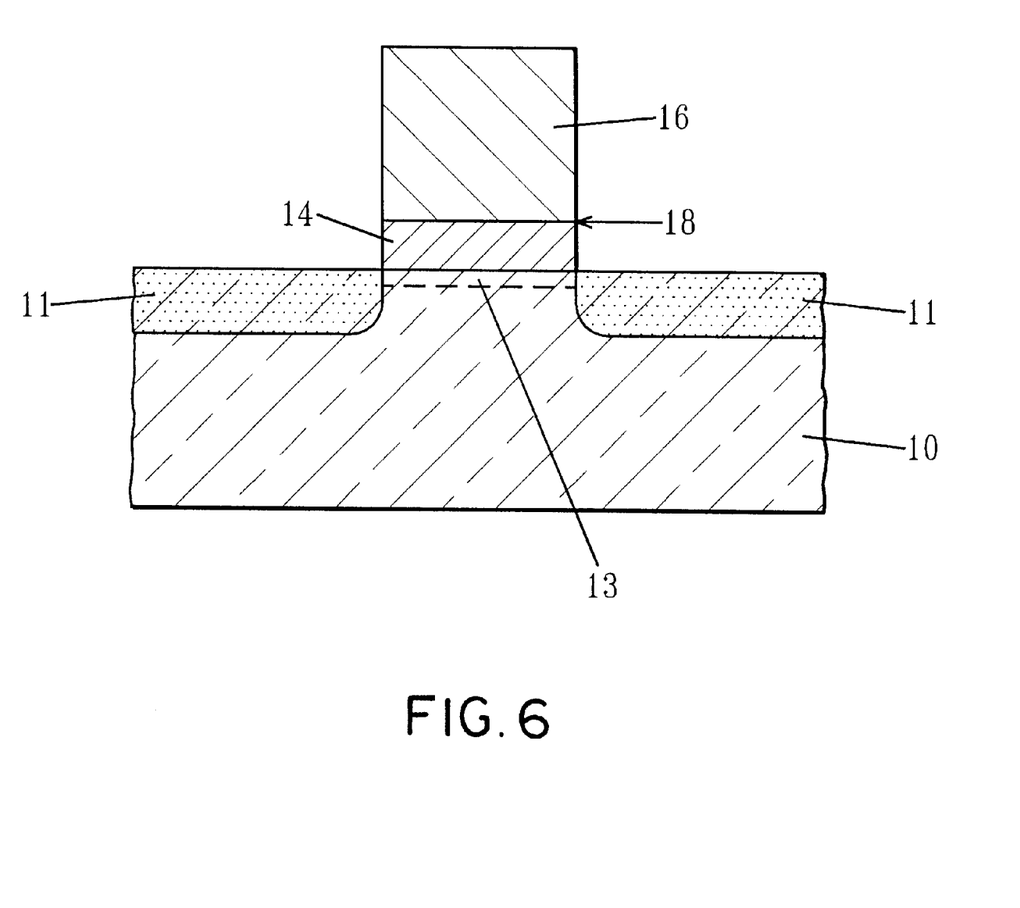
FIG. 6 is a cross-sectional view of a FET which includes the poly Si/high-k dielectric film stack of the present invention.

FIG. 6 is a cross-sectional view of a FET which includes the poly Si/high-k dielectric film stack of the present invention. Specifically, the FET shown in FIG. 6 includes semiconductor substrate 10 having diffusion regions (i.e., source/drain) 11 formed therein as well as active device region 13 (i.e., channel) which electrically connects the diffusion regions together. The FET structure further comprises a patterned gate region which includes high-k dielectric material 14 as the gate dielectric, and polysilicon layer 16 as the gate conductor. Although optional interfacial layer 12 is not shown in FIG. 6, it may be present in the FET structure shown, i.e., between the upper surface of the substrate and the high-k dielectric material.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method of forming a polysilicon layer on an exposed surface of a high-k dielectric material, said method comprising the steps of:
    (a) heating a semiconductor structure containing an exposed surface of high-k dielectric material to a temperature of from about 350° to about 700° C. inside a deposition reactor chamber, said high-k dielectric material having a dielectric constant, k, of greater than 8; and
    (b) depositing a layer of polysilicon on said exposed surface of said high-k dielectric material, wherein said depositing is performed in said reactor chamber using a Si-containing precursor gas which is diluted with an inert gas whereby said layer of polysilicon contains a lower hydrogen content than that obtained from an undiluted Si-containing precursor gas.

2. The method of claim 1 wherein said semiconductor structure comprises at least a semiconductor substrate.

3. The method of claim 2 further comprising forming an interfacial layer on said substrate prior to formation of said high-k dielectric and thereafter forming said high-k dielectric on said interfacial layer.

4. The method of claim 3 wherein said interfacial layer comprises an oxide, a nitride, an oxynitride, or mixtures and multilayers thereof.

5. The method of claim 3 wherein said interfacial layer is formed by rapid thermal oxidation (RTO), nitridation (RTN), oxynitridation (RTON), remote or direct plasma oxidation (RO), wet chemical oxidation or any combination thereof.

6. The method of claim 3 wherein said interfacial layer has a thickness of less than about 10 Å.

7. The method of claim 6 wherein said interfacial layer has a thickness of from about 2 to about 8 ⊂.

8. The method of claim 1 wherein said deposition reactor chamber is a chemical vapor deposition reactor chamber or a plasma enhanced chemical vapor deposition reactor chamber.

9. The method of claim 1 wherein said heating step is performed at a temperature of from about 500° to about 600° C.

10. The method of claim 1 wherein said depositing step is performed at a base pressure of from about 2 mtorr to about 10 torr.

11. The method of claim 1 with said hydrogen content is less than about 50 atomic percent.

12. The method of claim 1 wherein said Si-containing precursor gas is a Si-containing compound or mixtures thereof having the formula $H_{4-x}SiR_x$ wherein R is alkyl, alkene, alkynyl, alkoxy, halide, amine, aryl, cycloalkene or mixtures thereof, and x is 0, 1, 2 or 3.

13. The method of claim 12 wherein said Si-containing precursor gas comprises silane, disilane, dimethylsilane, diethylsilane, dichlorosilane or mixtures thereof.

14. The method of claim 13 wherein said Si-containing precursor gas is silane.

15. The method of claim 1 wherein said Si-containing precursor gas further includes a doping agent.

16. The method of claim 15 wherein said doping agent is B, As, Sb or P.

17. The method of claim 1 wherein said inert gas comprises He, Ar, Ne, Xe, Kr, $N_2$ or mixtures thereof.

18. The method of claim 17 wherein said inert gas comprises He.

19. The method of claim 1 further comprising annealing said semiconductor structure at a temperature of from about 800° to about 1050° C. for a time period of from about 1 to about 30 seconds.

20. The method of claim 19 wherein said annealing is performed at a temperature of from about 950° to about 1005° C. for a time period of from about 5 to about 10 seconds.

21. A semiconductor structure comprising:
    a semiconductor substrate having an upper surface;
    a layer of high-k dielectric material located on said upper surface, said high-k dielectric material having a dielectric constant, k, of greater than 8; and a layer of polysilicon having a hydrogen content of less than about 50 atomic percent located on said layer of high-k dielectric material, wherein an interface exists between said high-k dielectric material and said polysilicon that is uniform.

22. The semiconductor structure of claim 21 wherein said semiconductor substrate comprises diffusion regions which are electrically connected through a channel region.

23. The semiconductor structure of claim 21 wherein said semiconductor substrate comprises a semiconducting material selected from the group consisting of Si, Ge, SiGe, GaP, InAs, InP, Si/SiGe and Si/SiO$_2$/Si.

24. The semiconductor structure of claim 21 wherein an optional interfacial layer is formed on said semiconductor substrate prior to formation of said high-k dielectric material.

25. The semiconductor structure of claim 24 wherein said interfacial layer comprises an oxide, a nitride, an oxynitride, or mixtures and multilayers thereof.

26. The semiconductor structure of claim 24 wherein said interfacial layer has a thickness of less than about 10 Å.

27. The semiconductor structure of claim 26 wherein said interfacial layer has a thickness of from about 2 to about 8 Å.

28. The semiconductor structure of claim 21 wherein said high-k dielectric material comprises a binary metal oxide, silicates and aluminates of a binary metal oxide, a perovskite-type oxide and multilayers thereof.

29. The semiconductor structure of claim 28 wherein said high-k dielectric is a binary metal oxide selected from the group consisting of ZrO$_2$, TiO$_2$, Ta$_2$O$_5$, HfO$_2$ and Al$_2$O$_3$.

30. The semiconductor structure of claim 21 wherein said high-k dielectric is ZrO$_2$.

31. The semiconductor structure of claim 21 wherein said polysilicon is patterned to provide a capacitor.

32. The semiconductor structure of claim 21 wherein said polysilicon and said high-k dielectric material are patterned to provide a field effect transistor.

33. The semiconductor structure of claim 21 wherein said polysilicon is doped with a doping agent.

34. The semiconductor structure of claim 33 wherein said doping agent is B, As, Sb, or P.

35. The semiconductor structure of claim 21 wherein said interface is continuous.

36. The semiconductor structure of claim 21 wherein said interface is substantially planar and has the contour of the underlying high-k dielectric material.

37. A field effect transistor comprising:

a semiconductor substrate having an upper surface;

a source and drain region located in said upper surface of said substrate;

a channel region positioned between said source and drain regions;

a layer of high-k dielectric material located on said upper surface, said high-k dielectric material having a dielectric constant, k, of greater than 8; and a layer of polysilicon having a hydrogen content of less than about 50 atomic percent located on said layer of high-k dielectric material, wherein an interface exists between said high-k dielectric material and said polysilicon that is uniform.

38. The field effect transistor of claim 37 wherein said interface is continuous.

39. The field effect transistor of claim 37 wherein said interface is substantially planar and has the contour of the underlying high-k dielectric material.

* * * * *

UNITED STATES PATENT AND TRADEMARK OFFICE
CERTIFICATE OF CORRECTION

PATENT NO.   : 6,573,197 B2                                                 Page 1 of 1
DATED        : June 3, 2003
INVENTOR(S)  : Alessandro C. Callegari et al.

It is certified that error appears in the above-identified patent and that said Letters Patent is hereby corrected as shown below:

Column 8,
Line 24, "about 8 $\subset$ ." should read -- about 8 Å --

Signed and Sealed this

Fourteenth Day of October, 2003

JAMES E. ROGAN
*Director of the United States Patent and Trademark Office*